(12) United States Patent
Park et al.

(10) Patent No.: US 10,566,266 B2
(45) Date of Patent: Feb. 18, 2020

(54) SEMICONDUCTOR DEVICE

(71) Applicant: SK hynix Inc., Icheon-si, Gyeonggi-do (KR)

(72) Inventors: Heat Bit Park, Icheon-si (KR); Ji Hwan Kim, Seoul (KR); Dong Uk Lee, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/902,913

(22) Filed: Feb. 22, 2018

(65) Prior Publication Data
US 2018/0374779 A1 Dec. 27, 2018

(30) Foreign Application Priority Data
Jun. 21, 2017 (KR) .................. 10-2017-0078510

(51) Int. Cl.
| | |
|---|---|
| *H01L 23/48* | (2006.01) |
| *G11C 29/48* | (2006.01) |
| *H01L 23/485* | (2006.01) |
| *G11C 5/04* | (2006.01) |
| *H01L 23/31* | (2006.01) |
| *G11C 29/12* | (2006.01) |

(52) U.S. Cl.
CPC .............. *H01L 23/481* (2013.01); *G11C 5/04* (2013.01); *G11C 29/1201* (2013.01); *G11C 29/48* (2013.01); *H01L 23/3114* (2013.01); *H01L 23/485* (2013.01)

(58) Field of Classification Search
CPC ............. H01L 23/481; H01L 21/76898; H01L 21/768; G11C 5/04
See application file for complete search history.

(56) References Cited

U.S. PATENT DOCUMENTS

| | | | |
|---|---|---|---|
| 2011/0084722 A1* | 4/2011 | Nishioka .................. | G11C 5/02 324/762.01 |
| 2012/0124408 A1* | 5/2012 | Byeon ..................... | G11C 5/04 713/501 |
| 2012/0267776 A1* | 10/2012 | Nin ....................... | H01L 23/481 257/737 |
| 2012/0273782 A1* | 11/2012 | Goel ...................... | H01L 22/32 257/48 |

FOREIGN PATENT DOCUMENTS

| | | |
|---|---|---|
| KR | 102011039205 A | 4/2011 |
| KR | 1020140134011 A | 11/2014 |

* cited by examiner

*Primary Examiner* — Wael M Fahmy
*Assistant Examiner* — Sarah K Salerno
(74) *Attorney, Agent, or Firm* — William Park & Associates Ltd.

(57) ABSTRACT

A semiconductor device includes a plurality of stacked chips is disclosed. Each of the stacked chips includes a plurality of through vias arranged in a regular polygonal shape. The through vias of each chip are formed at corresponding positions in a stacked direction. The respective through vias of each chip are electrically connected to through vias of a chip adjacent in the stacked direction in a manner that the connected through vias are spaced apart from one another in substantially the same direction.

18 Claims, 13 Drawing Sheets

SEMICONDUCTOR DEVICE

CROSS-REFERENCE TO RELATED APPLICATION

This application claims priority based upon Korean patent application No. 10-2017-0078510, filed on Jun. 21, 2017, the disclosure of which is hereby incorporated in its entirety by reference herein.

BACKGROUND OF THE INVENTION

1. Technical Field

Embodiments of the present disclosure relate to a semiconductor device, and more particularly to a semiconductor device having a through via structure, that is capable of reducing a skew between channels.

2. Related Art

In order to increase an integration degree of a semiconductor device, a three-dimensional (3D) semiconductor device has recently been developed, in which a plurality of chips is stacked and packaged in a single package. The 3D semiconductor device is formed by vertically stacking two or more chips, such that the semiconductor device may acquire a high degree of integration in a same space.

There are various schemes for implementing the 3D semiconductor device. As a representative example of the schemes, a plurality of chips having the same structure may be stacked, and the stacked chips are connected to one another through a wire such as a metal line, such that the connected chips may operate as a single semiconductor device.

Recently a Through Silicon Via (TSV) scheme for electrically interconnecting all chips has been used by allowing the plurality of stacked chips to be penetrated by a through via. The semiconductor device using the TSV allows individual chips to be vertically penetrated such that the individual chips are interconnected, to reduce a package area more than another semiconductor device configured to interconnect a plurality of chips through a wire (or line) located at an edge.

Each of the plurality of chips contained in the aforementioned semiconductor device may construct a channel. The respective channels may receive different control signals or different data, and the plurality of chips may operate independently from each other. In this case, the plurality of chips may have different lengths of lines needed for data transmission, such that a skew between channels corresponding to the respective chips may occur.

SUMMARY OF THE INVENTION

Various embodiments of the present disclosure are directed to providing a semiconductor device that substantially obviates one or more problems due to limitations and disadvantages of the related art.

The embodiment of the present disclosure relates to a semiconductor device for reducing a skew between channels.

In accordance with an embodiment of the present disclosure, a semiconductor device includes a plurality of stacked chips. Each of the stacked chips may include a plurality of through vias arranged in a polygonal shape. The plurality of through vias of each chip may be formed at corresponding positions in a stacked direction. The respective through vias of each chip may be electrically connected to through vias of a chip adjacent in a stacked direction in a manner that the connected through vias are spaced apart from one another in substantially the same direction.

In accordance with an embodiment of the present disclosure, a semiconductor device includes a plurality of stacked chips comprising a first chip, a second chip adjacent to one surface of the first chip, and a third chip adjacent to another surface of the first chip. Each of the stacked chips may include a plurality of through vias arranged in a polygonal shape. The plurality of through vias of each chip may be formed at corresponding positions in a stacked direction. A first through via formed in the first chip and a second through via formed in the second chip may be connected to each other through a first line, and the first through via formed in the first chip and a third through via formed in the third chip may be connected to each other through a second line. An extension direction of the first line may be different from an extension direction of the second line.

In accordance with another embodiment of the present disclosure, a semiconductor device includes a plurality of stacked chips. Each of the stacked chips may include a plurality of through-via groups each including a plurality of through vias arranged in a polygonal shape. The through vias contained in each through-via group may be allocated different channels. The plurality of through-via groups of each chip may be formed at corresponding positions in a stacked direction. Different channels are allocated to through vias formed at corresponding positions in the stacked direction. The respective through-via groups of each chip may be connected to through vias of a chip adjacent in a stacked direction through a line in a manner that lengths of the respective channels are substantially identical to one another.

In accordance with still another embodiment of the present disclosure, a semiconductor device including a plurality of stacked chips includes: each of the stacked chips including a plurality of through vias respectively allocated a plurality of channels. The plurality of through vias of each chip may be formed at corresponding positions in a stacked direction. Different channels are allocated to through vias formed at corresponding positions in the stacked direction. The respective through vias of each chip may be electrically connected to through vias that are formed in a chip adjacent to one side in a stacked direction and correspond to the same channel, through a first line, and may be electrically connected to through vias that are formed in a chip adjacent to another side in the stacked direction and correspond to the same channel, through a second line. The first line may be substantially identical in length to the second line.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. Wherever possible, the same reference numbers will be used throughout the drawings to refer to the same or like parts.

Figure 1:
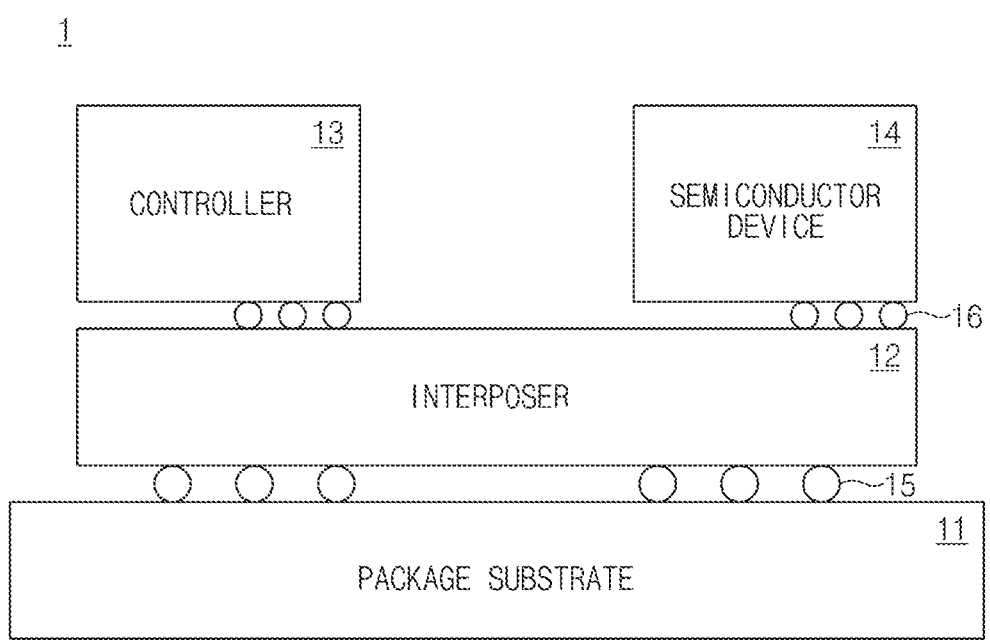
FIG. 1 is a view illustrating a representation of an example of a semiconductor system according to an embodiment of the present disclosure.

FIG. 1 is a view illustrating a representation of an example of a semiconductor system 1 according to an embodiment of the present disclosure.

Referring to FIG. 1, the semiconductor system 1 may include a package substrate 11, an interposer substrate 12, a controller 13, and a semiconductor device 14. The interposer substrate 12 may be stacked over the package substrate 11, and may be interconnected through an electrical connection means 15, for example, a bump ball, a ball grid array, a C4 bump, etc. A signal path for signal transmissions may be formed over the interposer substrate 12 and the package substrate 11. Although not shown in the drawings, the package substrate 11 may include at least one package ball, and the semiconductor system 1 may be coupled to an external electronic device through the package ball.

The controller 13 and the semiconductor device 14 may be stacked over the interposer substrate 12, and may be electrically interconnected through at least one micro bump 16. The controller 13 may communicate with the semiconductor device 14 through a signal path formed in the interposer substrate 12. Constituent components of the semiconductor system 1 may be packaged in a single package, and may be implemented as a System on Chip (SOC), a System In Package (SIP), a Multi-Chip Package (MCP), or a Flip-Chip Package (FCP).

The controller 13 may be a master device configured to control the semiconductor device 14. The controller 13 may be a Central Processing Unit (CPU), a Graphics Processing Unit (GPU), a Digital Signal Processor (DSP), an Application Processor (AP), a controller chip, or a memory controller chip.

The semiconductor device 14 may be a slave device controlled by the controller 13. The semiconductor device 14 may be a volatile memory device such as a Dynamic Random Access Memory (DRAM), or may be a non-volatile memory device such as a flash memory, a Phase Change Random Access Memory (PCRAM), a Resistive Random Access Memory (ReRAM), a Ferroelectric Random Access Memory (FeRAM), a Magnetic Random Access Memory (MRAM), or a Spin Transfer Torque Random Access Memory (STTRAM). Alternatively, the semiconductor device 14 may be constructed of a combination of at least two of the aforementioned volatile memories and the aforementioned non-volatile memories. In accordance with one embodiment, the semiconductor device 14 may be a stacked semiconductor device including a plurality of chips.

Figure 2:
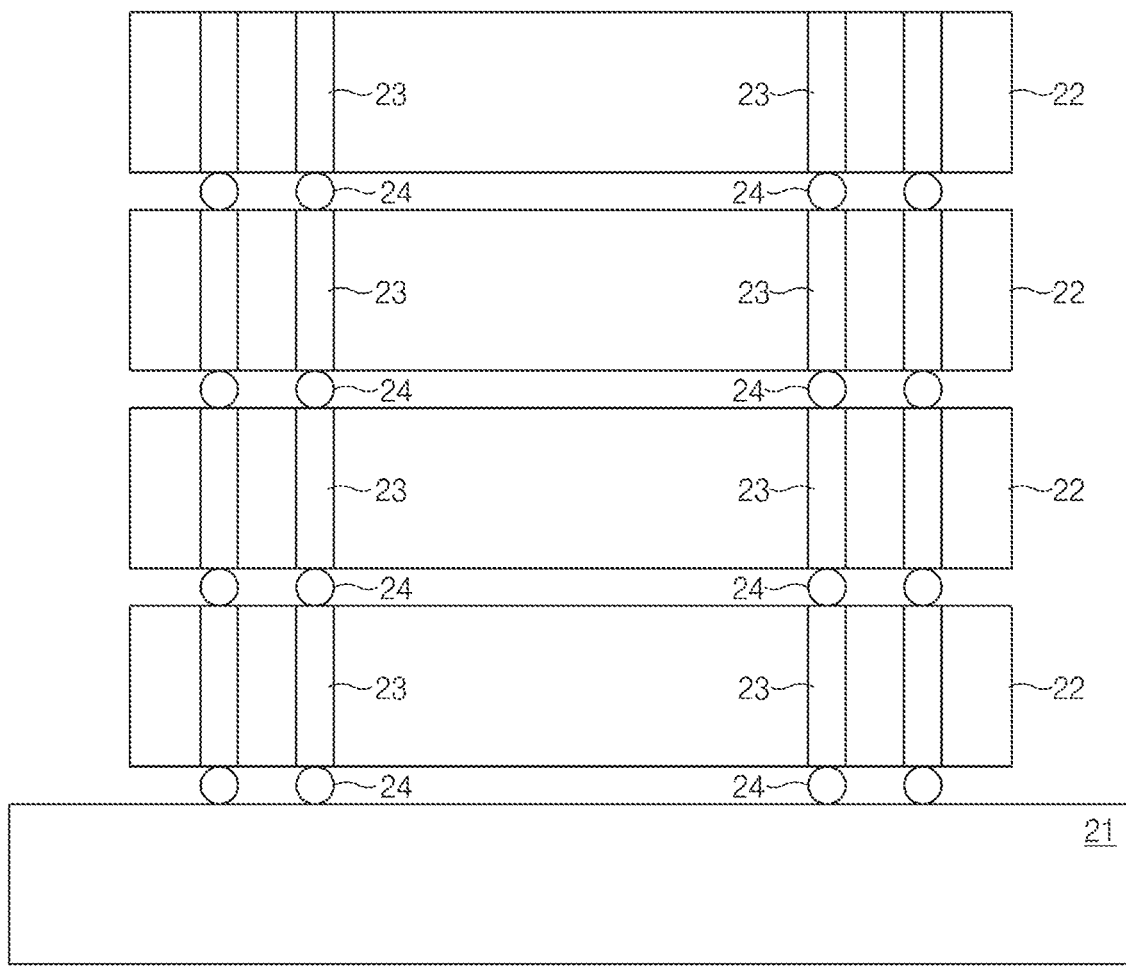
FIG. 2 is a view illustrating a representation of an example of a semiconductor device according to an embodiment of the present disclosure.

FIG. 2 is a view illustrating a representation of an example of a semiconductor device 2 according to an embodiment of the present disclosure.

Referring to FIG. 2, the semiconductor device 2 may be identical to the semiconductor device 14 shown in FIG. 1. In FIG. 2, the semiconductor device 2 may include a base chip 21 and a plurality of stacked chips 22. The stacked chips 22 may be sequentially stacked over the base chip 21. The stacked chips 22 may include at least one through via 23, and may be electrically coupled to the base chip 21 through at least one micro bump 24 and at least one through via 23. Each of the stacked chips 22 may include a memory cell array for storing data therein.

The base chip 21 may be coupled to the controller 13 through the interposer substrate 12 shown in FIG. 1. The base chip 21 may transmit a control signal received from the controller 13 to the stacked chips 22, and may transmit an output signal of the stacked chips 22 to the controller 13. In accordance with one embodiment, the base chip 21 may include circuits configured to control the stacked chips 22, and may include a memory cell array configured to store data in substantially the same manner as data is stored in the stacked chips 22.

The semiconductor device 2 may include a plurality of channels. The channels may refer to parts or mediums that are capable of simultaneously independently operating of one another by receiving different commands, different addresses, and different data. In accordance with one embodiment, the stacked chips 22 may include independent channels. Data of the plurality of channels should be input and output independently of each other, such that each of the stacked chips 22 may include a plurality of through vias for transmitting data of the plurality of channels.

A connection structure of the through vias of the semiconductor device according to an embodiment of the present disclosure will hereinafter be described with reference to FIGS. 3, 4A~4D, and 5.

Figure 3:
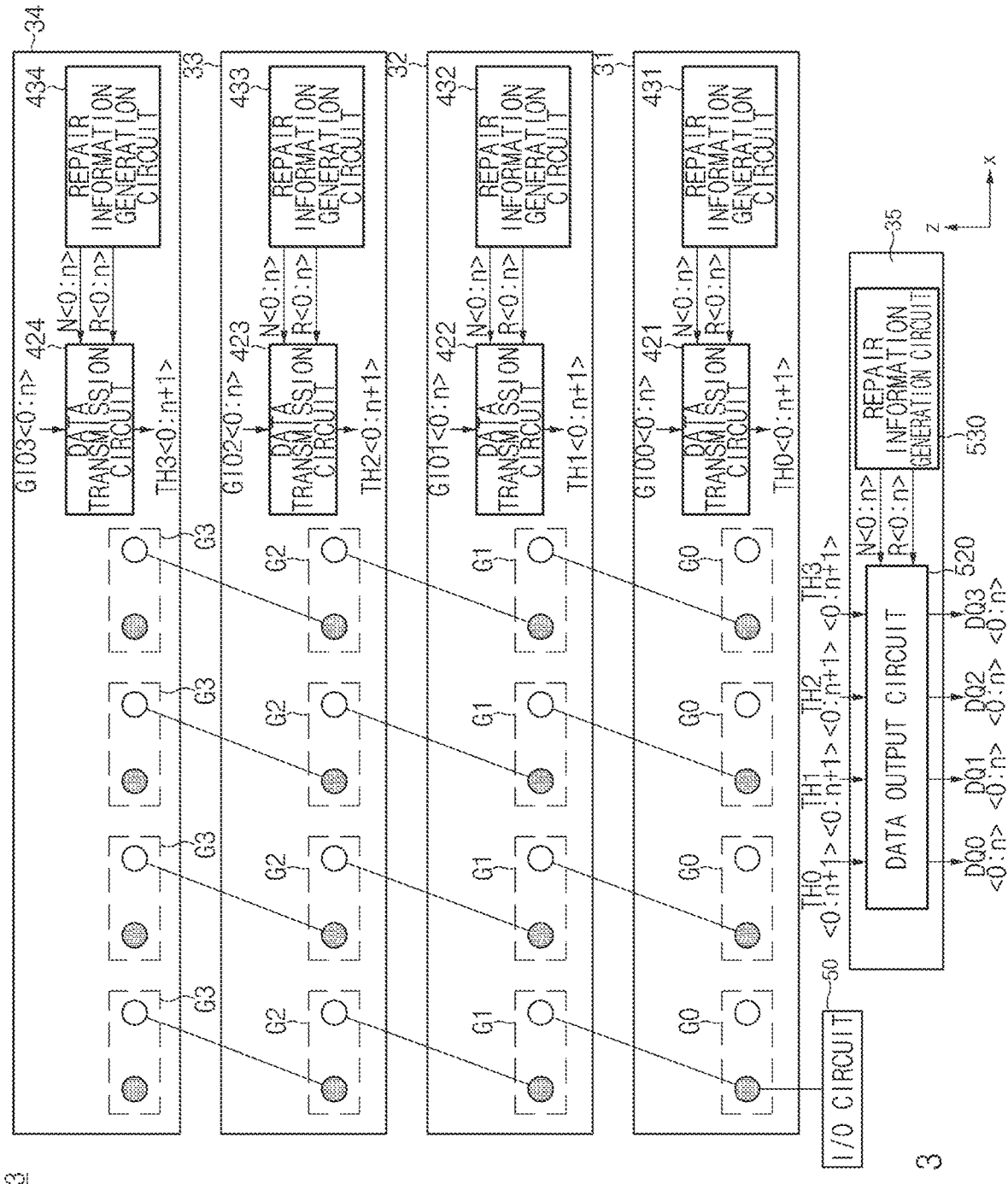
FIG. 3 is a circuit diagram illustrating a representation of an example of a semiconductor device according to an embodiment of the present disclosure.
Figure 4A:
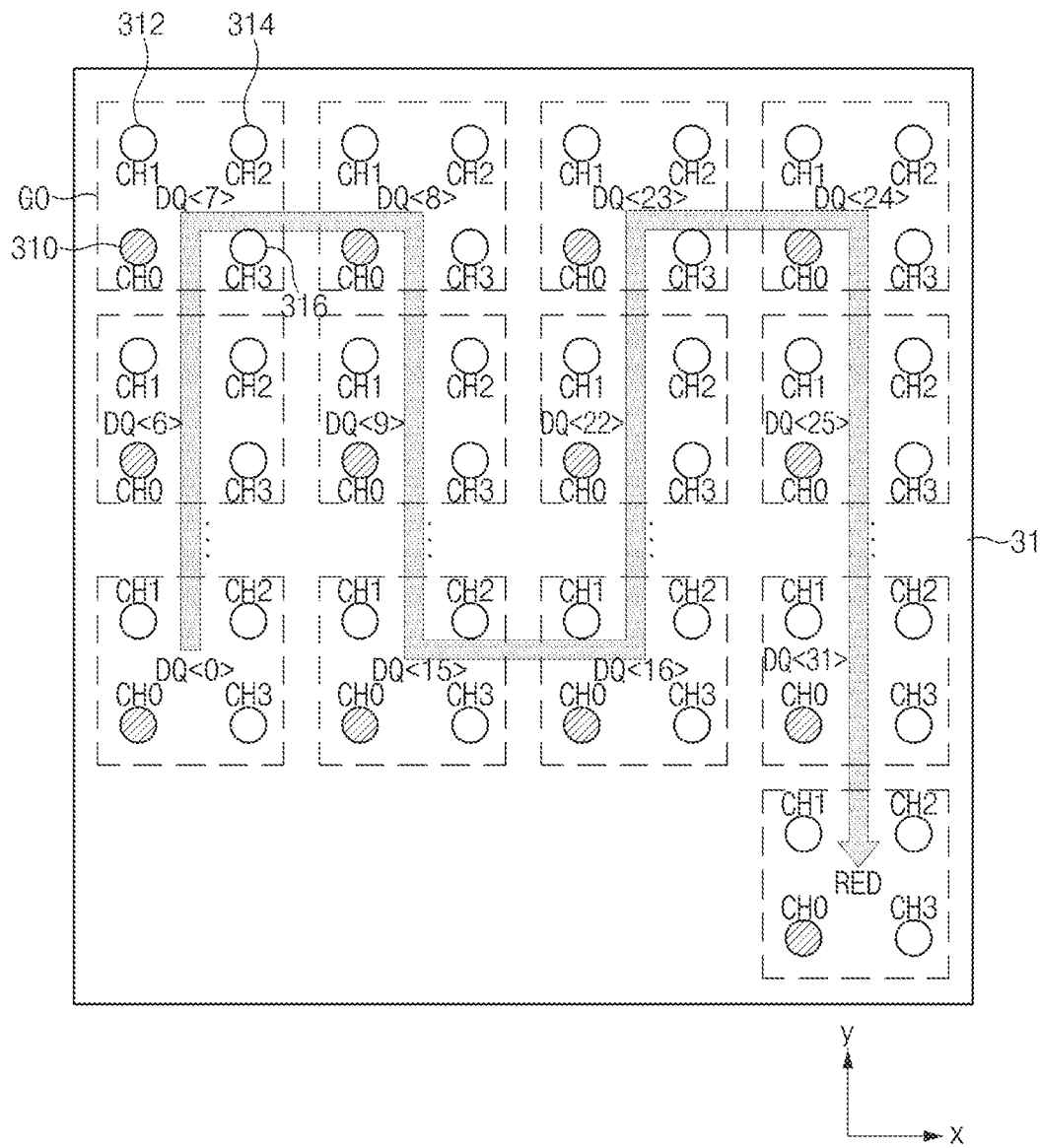
FIGS. 4A to 4D are plan views illustrating a representation of an example arrangement of through vias for use in respective stacked chips of FIG. 3.

FIG. 3 is a circuit diagram illustrating a representation of an example of a semiconductor device according to an embodiment of the present disclosure. FIGS. 4A to 4D are plan views illustrating a representation of an example arrangement of through vias for use in the stacked chips 31~34 of FIG. 3. FIG. 5 is a perspective view illustrating a representation of an example of a connection structure of some through vias shown in FIG. 3.

In FIG. 3, in order to more definitely explain a structure of the semiconductor device 3 according to an embodiment of the present disclosure, a stacked format of four stacked chips 31~34 are denoted by a vertical cross-sectional view, and through vias configured to penetrate the respective stacked chips 31~34 is denoted by circles as viewed from the plane. In FIGS. 4A~4D and 5, each of the through vias is denoted by a circle, without being limited thereto.

In FIGS. 3, 4A~4D, and 5, it is assumed that the stacked chips 31~34 are extended, are disposed perpendicular to one another in an X-axis direction and a Y-axis direction, and are stacked in a Z-axis direction for convenience of description and better understanding of the present disclosure. Here, the X-axis direction, the Y-axis direction, and the Z-axis direction are perpendicular to one another.

Referring to FIG. 3, the first to fourth stacked chips 31~34 may be stacked on one another. The first stacked chip 31 may be stacked as a lowermost layer, and the second to fourth stacked chips 32~34 may be sequentially stacked over the first stacked chip 31. The first to fourth stacked chips 31~34 may be electrically interconnected through microbumps disposed between the respective stacked chips as shown in FIG. 2. Further, in one example, the third stacked chip 33 may be adjacent to one surface of the second stacked chip 32, and the first stacked chip 31 may be adjacent to another surface of the second stacked chip 32. The second, third, and fourth stacked chips 32, 33, and 34 may be similarly arranged.

Each of the plurality of stacked chips 31~34 may include a plurality of through vias formed to pass therethrough. The plurality of through vias formed in the stacked chip 31 may be grouped into a group G0 of through vias, the plurality of through vias formed in the stacked chip 32 may be grouped into a group G1 of through vias, the plurality of through vias formed in the stacked chip 33 may be grouped into a group G2 of through vias, and the plurality of through vias formed in the stacked chip 34 may be grouped into a group G3 of through vias. That is, the stacked chip 31 may include at least one through-via group G0, the stacked chip 32 may include at least one through-via group G1, the stacked chip 33 may include at least one through-via group G2, and the stacked chip 34 may include at least one through-via group G3. For convenience of description, a through-via group formed in the stacked chip 31 is denoted by G0, a through-via group formed in the stacked chip 32 is denoted by G1, a through-via group formed in the stacked chip 33 is denoted by G2, and a through-via group formed in the stacked chip 34 is denoted by G3. The plurality of through vias G0~G3 (i.e., the through-via groups G0~G3) respectively formed in the stacked chips 31~34 may be formed at corresponding positions in a stacked direction (i.e., Z-axis direction). A reference or definition for grouping the plurality of through vias into 4 groups G0~G3 may be achieved on a channel basis.

Each of the through-via groups G0~G3 may include a plurality of through vias arranged in a regular polygonal shape on a plane of the stacked chips (i.e., X-Y plane). For example, as shown in FIGS. 4A to 4D, the stacked chips 31~34 may include the plurality of through-via groups G0~G3, respectively. Each of the through-via groups G0~G3 may be formed in a regular polygonal shape, and may include four through vias. The through-via groups formed in a single chip may have a same name.

Through-via signals corresponding to different channels may be transmitted using the plurality of through vias contained in a single through-via group G0, G1, G2, or G3. Referring to FIG. 4A, each square denoted by dotted lines may refer to the though-via group G0. In the through-via groups G0 of the stacked chip 31, through-via signals TH0<0>, TH0<1>, TH0<2>, ... TH0<32> corresponding to a first channel CH0 may be transmitted using through vias 310 located at lower left sides of the through-via groups G0. Through-via signals TH1<0>, TH1<1>, TH1<2>, ... TH1<32> corresponding to a second channel CH1 may be transmitted using through vias 312 located at upper left sides of the through-via groups G0. Through-via signals TH2<0>, TH2<1>, TH2<2>, ... TH2<32> corresponding to a third channel CH2 may be transmitted using through vias 314 located at upper right sides of the through-via groups G0. Through-via signals TH3<0>, TH3<1>, TH3<2>, ... TH3<32> corresponding using a fourth channel CH3 may be transmitted using through vias 316 located at lower right sides of the through-via groups G0. That is, as shown in FIG. 4A, the first channel CH0, the second channel CH1, the third channel CH2, and the fourth channel CH3 may be sequentially allocated to each through-via group G0 of the stacked chip 31 in a counterclockwise direction from the lower-left-side through via.

Figure 4B:
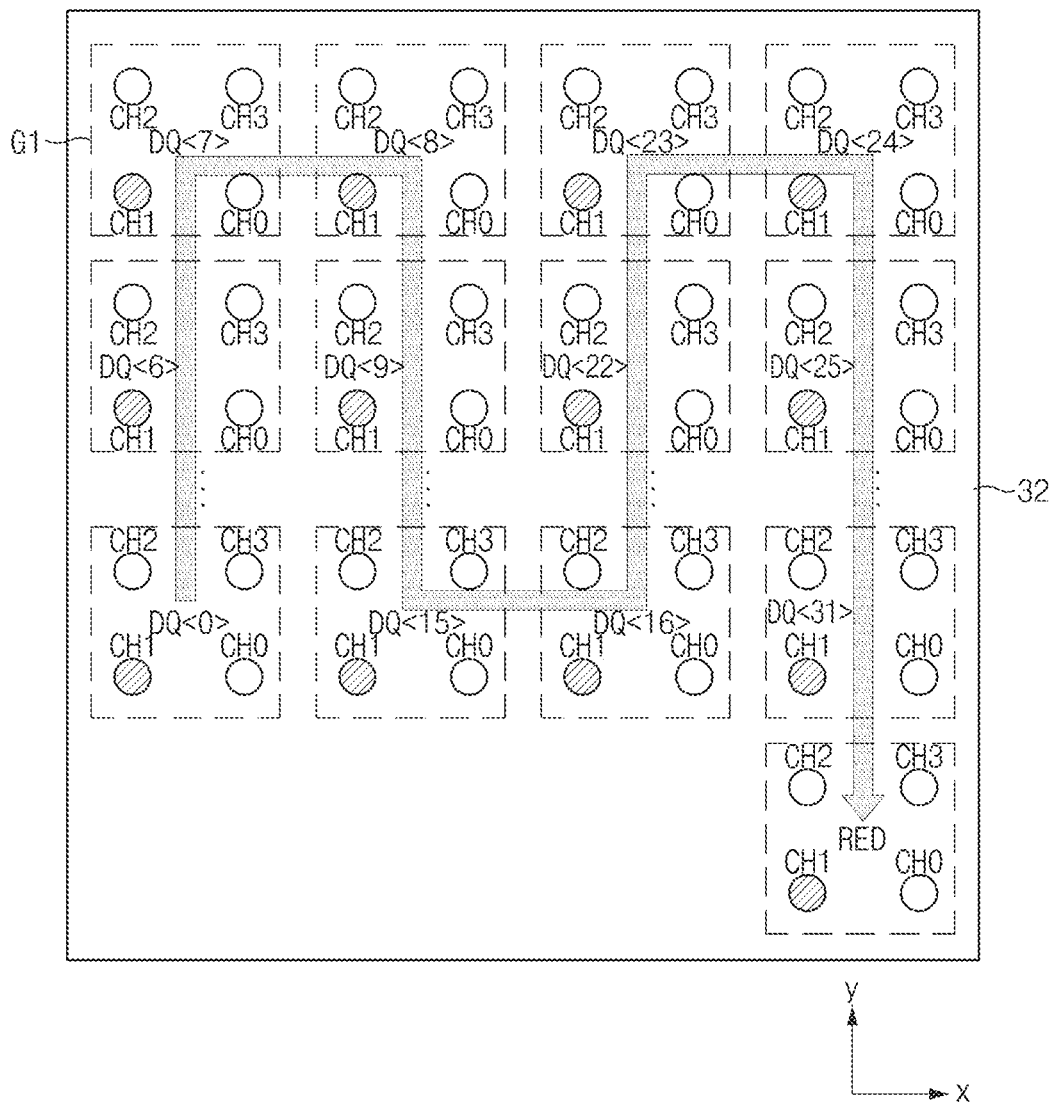
Figure 5:
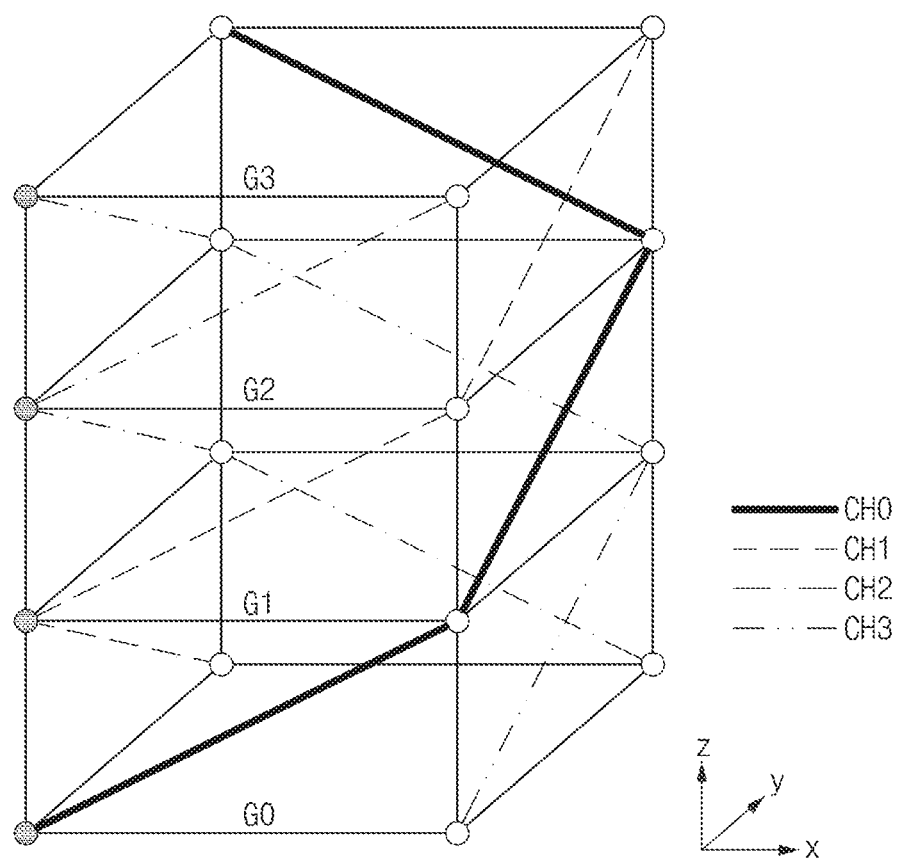
FIG. 5 is a perspective view illustrating a representation of an example of a connection structure of through vias shown in FIG. 3.

Referring to FIG. 4B, each square denoted by dotted lines may refer to the though-via group G1. In the through-via groups G1 of the stacked chip 32, through-via signals TH1<0>, TH1<1>, TH1<2>, ... TH1<32> corresponding to a second channel CH1 may be transmitted using through vias located at lower left sides of the through-via groups G1. Through-via signals TH2<0>, TH2<1>, TH2<2>, ... TH2<32> corresponding to a third channel CH2 may be transmitted using through vias located at upper left sides of the through-via groups G1. Through-via signals TH3<0>, TH3<1>, TH3<2>, ... TH3<32> corresponding to a fourth channel CH3 may be transmitted using through vias located at upper right sides of the through-via groups G1. Through-via signals TH0<0>, TH0<1>, TH0<2>, ... TH0<32> corresponding to a first channel CH0 may be transmitted using through vias located at lower right sides of the through-via groups G1. That is, as shown in FIG. 4B, the second channel CH1, the third channel CH2, the fourth channel CH3, and the first channel CH0 may be sequentially allocated to each through-via group G1 of the stacked chip 32 in a counterclockwise direction from the lower-left-side through via.

Figure 4C:
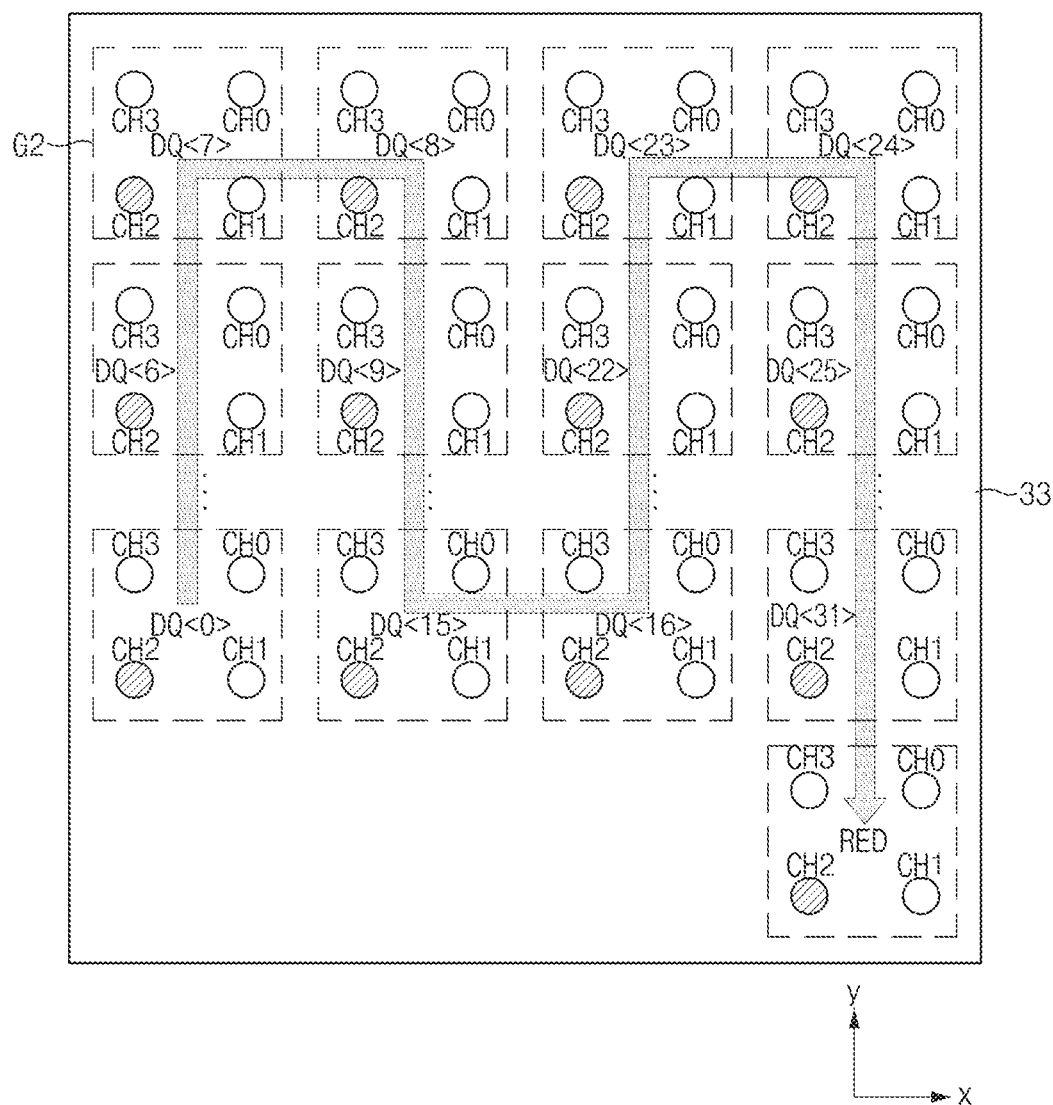

Referring to FIG. 4C, each square denoted by dotted lines may refer to the though-via group G2. In the through-via groups G2 of the stacked chip 33, through-via signals TH2<0>, TH2<1>, TH2<2>, ... TH2<32> corresponding to a third channel CH2 may be transmitted using through vias located at lower left sides of the through-via groups G2. Through-via signals TH3<0>, TH3<1>, TH3<2>, ... TH3<32> corresponding to a fourth channel CH3 may be transmitted using through vias located at upper left sides of the through-via groups G2. Through-via signals TH0<0>, TH0<1>, TH0<2>, ... TH0<32> corresponding to a first channel CH0 may be transmitted using through vias located at upper right sides of the through-via groups G2. Through-via signals TH1<0>, TH1<1>, TH1<2>, ... TH1<32> corresponding to a second channel CH1 may be transmitted using through vias located at lower right sides of the through-via groups G2. That is, as shown in FIG. 4C, the third channel CH2, the fourth channel CH3, the first channel CH0, and the second channel CH1 may be sequentially allocated to each through-via group G2 of the stacked chip 33 in a counterclockwise direction from the lower-left-side through via.

Figure 4D:
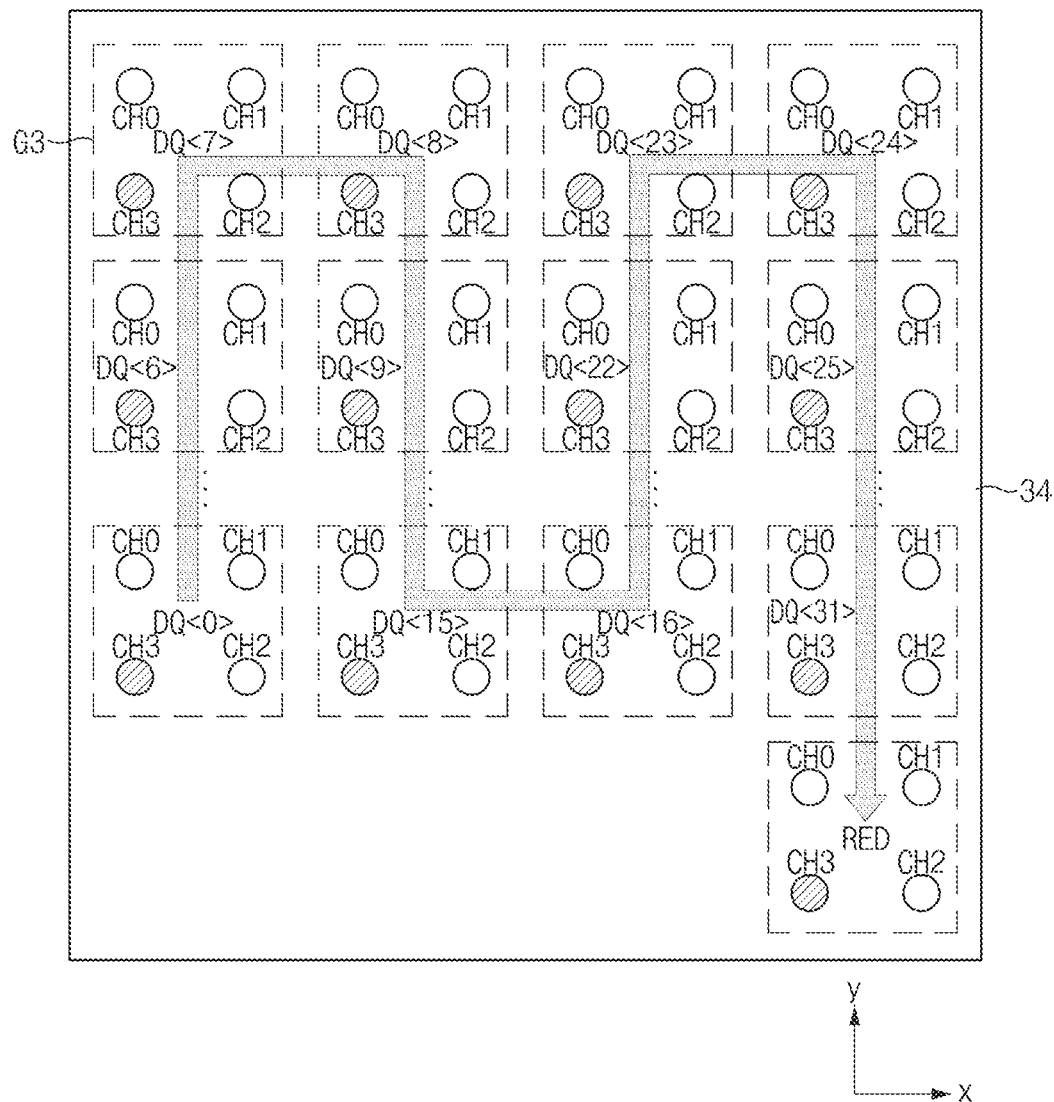

Referring to FIG. 4D, each square denoted by dotted lines may refer to the though-via group G3. In the through-via groups G3 of the stacked chip 33, through-via signals TH3<0>, TH3<1>, TH3<2>, ... TH3<32> corresponding to a fourth channel CH3 may be transmitted using through vias located at lower left sides of the through-via groups G3. Through-via signals TH0<0>, TH0<1>, TH0<2>, ... TH0<32> corresponding to a first channel CH0 may be transmitted using through vias located at upper left sides of the through-via groups G3. Through-via signals TH1<0>, TH1<1>, TH1<2>, ... TH1<32> corresponding to a second channel CH1 may be transmitted using through vias located at upper right sides of the through-via groups G3. Through-via signals TH2<0>, TH2<1>, TH2<2>, ... TH2<32> corresponding to a third channel CH2 may be transmitted using through vias located at lower right sides of the through-via groups G3. That is, as shown in FIG. 4D, the fourth channel CH3, the first channel CH0, the second channel CH1, and the third channel CH2 may be sequentially allocated to each through-via group G3 of the stacked chip 34 in a counterclockwise direction from the lower-left-side through via.

As described above, through-via signals corresponding to different channels may be transmitted using each of the plurality of through-via groups G0~G3, respectively. A plurality of through-via signals corresponding to the same channel may be transmitted in each of the stacked chips 31~34. For example, in accordance with this embodiment, through-via signals of 33 bits for each of four channels CH0~CH3 may be transmitted.

For convenience of description and better understanding of the present disclosure, a 'b'-th through-via signal of an 'a'-th channel will hereinafter be denoted by THa–1<b–1>. For example, TH3<16> may refer to a 17-th through-via signal of the fourth channel. A b-th through-via signal of the first channel, a b-th through-via signal of the second channel, a b-th through-via signal of the third channel, or a b-th through-via signal of the fourth channel will hereinafter be denoted by TH<b–1>. For example, TH<0> may refer to first through-via signals of the first to fourth channels.

Referring to FIG. 4A, the first through-via signals TH<0> of the first to fourth channels CH0~CH3 may be transmitted using the lower-left-side through-via group G0. Although not shown in the drawings, the second through-via signals TH<1> of the first to fourth channels CH0~CH3 may be transmitted to a neighbor through-via group G0 located above the left-lower-side through-via group G0. In this way, eighth through-via signals TH<7> may be transmitted to a left-upper-side through-via group G0, and ninth through-via signals TH<8> may be transmitted to a through-via group G0 located at the right side of the left-upper-side through-via group G0. That is, a sequence number of the through-via signal may increase in an arrow direction shown in FIG. 4A. Another through-via group G0 is located at the right lower side, and this right-lower-side through-via group G0 may be additionally used for a repair operation. A through-via signal transmitted through the right-lower-side through-via group G0 may be denoted by a 33$^{rd}$ through-via signal TH<32>.

If a plurality of through-via groups G0 is formed in a single stacked chip 31, the same channel may be allocated to through vias located at corresponding positions within each through-via group G0. That is, as shown in FIG. 4A, within a single through-via group G0, the first channel CH0 may be allocated to the left-lower-side through via, the second channel CH1 may be allocated to the left-upper-side through via, the third channel CH2 may be allocated to the right-upper-side through via, and the fourth channel CH3 may be allocated to the right-lower-side through via.

Although the through-via group G0 formed in the stacked chip 31 has been disclosed with reference to FIG. 4A, similar structures may also be applied to the stacked chips 32~34. However, as shown in FIGS. 4B to 4D, allocation orders (or sequences) of channels may be different from each other in the through-via groups G1~G3 formed in the stacked chips 32~34. Referring to FIG. 4B, in a single through-via group G1, the second channel CH1 may be allocated to the left-lower-side through via, the third channel CH2 may be allocated to the left-upper-side through via, the fourth channel CH3 may be allocated to the right-upper-side through via, and the first channel CH0 may be allocated to the right-lower-side through via. Referring to FIG. 4C, in a single through-via group G2, the third channel CH2 may be allocated to the lower-left-side through via, the fourth channel CH3 may be allocated to the upper-left-side through via, the first channel CH0 may be allocated to the upper-right-side through via, and the second channel CH1 may be allocated to the lower-right-side through via. Referring to FIG. 4D, in a single through-via group G3, the fourth channel CH3 may be allocated to the lower-left-side through via, the first channel CH0 may be allocated to the upper-left-side through via, the second channel CH1 may be allocated to the upper-right-side through via, and the third channel CH2 may be allocated to the lower-right-side through via.

FIG. 5 is a perspective view illustrating a connection structure of through-via groups G0~G3 formed at corresponding positions in a stacked direction (Z-axis direction). For example, FIG. 5 illustrates a connection structure among the lower-left-side through-via group G0 of FIG. 4A, the lower-left-side through-via group G1 of FIG. 4B, the lower-left-side through-via group G2 of FIG. 4C, and the lower-left-side through-via group G3 of FIG. 4D. In the semiconductor device 3 according to one embodiment of the present disclosure, through-via signals corresponding to the same sequence numbers of the respective channels CH0~CH3 may be transmitted using the through-via groups G0~G3 formed at corresponding positions in a stacked direction (Z-axis direction). For example, referring to FIGS. 4A to 4D, first through-via signals TH<0> of the fourth to fourth channels may be transmitted using the through-via groups G0~G3 located at the left lower side in a stacked-chip plane (X-Y plane). Therefore, the sequence numbers of the through-via signals transmitted using the respective through vias are omitted from FIG. 5, and only sequence numbers of channels allocated to the respective through vias are shown in FIG. 5.

Referring to FIG. 5, in the through-via groups G0~G3 adjacent to one another in the Z-axis direction, through vias corresponding to the same channel may be connected to each other. For example, as denoted by bold solid lines of FIG. 5, through vias corresponding to the first channel CH0 (i.e., a lower-left-side through via of the through-via group G0, a lower-right-side through via of the through-via group G1, an upper-right-side through via of the through-via group G2, and an upper-left-side through via of the through-via group G3) may be connected to each other. As denoted by dotted lines of FIG. 5, through vias corresponding to the second channel CH1 (i.e., an upper-left-side through via of the through-via group G0, a lower-left-side through via of the through-via group G1, a lower-right-side through via of the through-via group G2, and an upper-right-side through via of the through-via group G3) may be connected to each other. As denoted by one-dot chain lines of FIG. 5, through vias corresponding to the third channels CH2 (i.e., an upper-right-side through via of the through-via group G0, an upper-left-side through via of the through-via group G1, a lower-left-side through via of the through-via group G2, and a lower-right-side through via of the through-via group G3) may be connected to each other. As denoted by two-dot chain lines of FIG. 5, through vias corresponding to the fourth channels CH3 (i.e., a lower-right-side through via of the through-via group G0, an upper-right-side through via of the through-via group G1, an upper-left-side through via of the through-via group G2, and a lower-left-side through via of the through-via group G3) may be connected to each other. In other words, through vias of the neighbor stacked chips 31~34 may be connected to each other in a spiral shape (or in some parts of a spiral shape) wound in the stacked direction (Z-axis direction). Thus, an extension direction of each line between each stacked chip 31~34 may differ. Further, the length of each line between each stacked chip 31~34 may be substantially identical. Thus, lengths of the channels CH0~CH3 may be substantially identical to one another. Further, an angle between a straight line connecting the lower-right-side through via of the stacked chip 32 to the lower-left-side through via of the stacked chip 31 and an axis in the stacked direction (Z-axis direction) is substantially identical to an angel between a straight line connecting the lower-right-side through via of the stacked chip 32 to the upper-right-side through via of the stacked chip 33 and the axis in the stacked direction, where the axis in the stacked direction passes through the lower-right-side through via of the stacked chip 32.

The semiconductor device 3 according to one embodiment of the present disclosure may include through vias having the above connection structures, such that transmission paths of signals corresponding to the respective channels are substantially identical to each other, resulting in reduction of skew between channels.

Input/output (I/O) operations and a repair operation of the semiconductor device 3 according to one embodiment of the present disclosure will hereinafter be described.

Referring to FIGS. 3, 4A~4D, and 5, through vias corresponding to the first channel CH0 in a plurality of through-via groups G0 of the stacked chip 31, through vias corresponding to the second channel CH1 in a plurality of through-via groups G1 of the stacked chip 32, through vias corresponding to the third channel CH2 in a plurality of through-via groups G2 of the stacked chip 33, and through vias corresponding to the fourth channel CH3 in a plurality of through-via groups G3 of the stacked chip 34 may be coupled to an input/output (I/O) circuit 50. One I/O circuit 50 is illustrated as connected to one through-via group, but there may be I/O circuits connected to all the through-via groups G1~G4 of the semiconductor chips 31~34. The I/O circuit may drive signals generated from the stacked chips 31~34 or output data of the stacked chips 31~34, and may transmit the driven signals or output data to the connected through vias. Alternatively, the I/O circuit may receive signals transmitted through the through vias, and may transmit the received signals to circuits contained in the stacked chips 31~34. The above-mentioned I/O circuit may include a transceiver and a selection circuit as will be described later in FIGS. 6A to 6D. In FIGS. 3, 4A~4D, and 5, each through via connected to the I/O circuit is denoted by a shaded (or painted) circle, and each through via not connected to the I/O circuit is denoted by an unshaded (or unpainted) circle. In the semiconductor device 3 according to this embodiment, only through-via signals corresponding to the first channel CH0 may be input to or output from the stacked chip 31. Only through-via signals corresponding to the second channel CH1 may be input to or output from the stacked chip 32. Only through-via signals corresponding to the third channel CH2 may be input to or output from the stacked chip 33. Only through-via signals corresponding to the fourth channel CH3 may be input to or output from the stacked chip 34. Therefore, in the through-via group G0 formed in the stacked chip 31, the I/O circuit only needs to be connected to through vias corresponding to the first channel CH0. In the through-via group G1 formed in the stacked chip 32, the I/O circuit needs to only be connected to through vias corresponding to the second channel CH1. In the through-via group G2 formed in the stacked chip 33, the I/O circuit needs to only be connected to through vias corresponding to the third channel CH2. In the through-via group G3 formed in the stacked chip 34, the I/O circuit needs to only be connected to through vias corresponding to the fourth channel CH3. As described above, the I/O circuit does not always connect to all the through vias. In this case, as shown in FIGS. 3 and 5, through vias connected to the I/O circuit may be arranged in a line in the stacked direction (Z-axis direction), such that it is easy to manufacture such through vias.

The repair operation of the semiconductor device 3 will hereinafter be described with reference to FIGS. 3, 4A~4D, and 5. In this embodiment, if a defective part occurs in a certain through via, data is transmitted using another through via instead of using the defective through via. The above-mentioned operation will hereinafter be referred to as a repair operation.

The semiconductor device 3 may include data transmission circuits 421~424 and information transmission circuits 431~434 as shown in FIG. 3.

In this embodiment, the data transmission circuit 421 formed in the first stacked chip 31 may output a global line output signal GIO0<0:n> of the first channel as a through-via signal TH0<0:n+1> of the first channel upon receiving first and second control signals N<0:n> and R<0:n>. The global line output signal GIO0<0:n> of the first channel may be output from inside the stacked chip 31, and may be input using through vias formed in the stacked chip 31. For example, if the first control signal N<0:n> is enabled, the data transmission circuit 421 may generate a through-via signal TH0<0:n> of the first channel in response to the global line output signal GIO0<0:n> of the first channel. If the second control signal R<0: n> is enabled, the data transmission circuit 421 may generate a through-via signal TH0<1:n+1> of the first channel in response to the global line output signal GIO0<0:n> of the first channel. In this case, the data transmission circuit 421 may shift the global line output signal GIO0<0:n> of the first channel one bit by one bit, thereby generating the through-via signal TH0<1: n+1> of the first channel. In this embodiment, global line output signals of 32 bits are transmitted to each channel, such that a value of n is set to 31 (n=31).

In other words, the data transmission circuit 421 may establish at least one through via to which the global line output signal GIO0<0:n> of the first channel is transmitted, upon receiving the first and second control signals N<0:n> and R<0:n>. For example, as shown in FIG. 4A, during a normal mode in which no defect occurs in through vias, the first control signal N<0:n> may be activated and the second control signal R<0:n> may be deactivated. In this case, the data transmission portion 421 may generate a through-via signal TH0<0:n> of the first channel, that has the same value as in the global line output signal GIO0<0:n> of the first channel. That is, as shown in FIG. 4A, through the shaded through via of the left-lower-side through-via group G0, the data transmission circuit 421 may transmit the first through-via signal TH0<0> of the first channel, that has the same value as the global line output signal GIO0<0> of the first channel. Through the shaded through via of another through-via group G1 located above the left-lower-side through-via group G0, the data transmission circuit 421 may transmit the second through-via signal TH0<1> of the first channel, that has the same value as the global line output signal GIO0<1> of the first channel. As a result, the plurality of through-via signals ranging from the third through-via signals of the first channel to the $32^{nd}$ through-via signals TH0<31> of the first channel may be transmitted in the same direction as the arrow.

In the repair mode in which a defect occurs in at least one through via, the first control signal N<0:n> may be deactivated and the second control signal R<0:n> may be activated. In this case, the data transmission circuit 421 may shift the global line output signal GIO0<0:n> one bit by one bit, thereby generating a through-via signal TH0<1:n+1>. In FIG. 4A, the data transmission circuit 421 may transmit the second through-via signal TH0<1> of the first channel, that is identical to the first global line output signal GIO0<0> of the first channel, through a shaded through via of a through-via group located above the left-lower-side through-via group G0, and may transmit the third through-via signal TH0<2> of the first channel, that is identical to the second global line output signal GIO0<1> of the first channel, through a through-via group located above the aforementioned through-via group. In this way, through-via signals ranging from the fourth through-via signal TH0<3> of the first channel to the 33$^{rd}$ through-via signal TH0<32> of the first channel may be transmitted in the same direction as the arrow. The stacked chips 31~34 may include repair information generation circuits 431~434, respectively. The repair information generation circuit 431 formed in the first stacked chip 31 may transmit first and second control signals N<0: n> and R<0: n> to the data transmission circuit 421. The repair information generation circuit 431 may be a constituent component, such as a fuse array, a register, etc. capable of storing information therein, and may include repair information or defect information of at least one through via. The repair information generation circuit 431 may test for the presence or absence of a defect in the through via, such that the repair information generation circuit 431 may store repair information in advance. The repair information generation circuit 431 may generate first and second control signals N<0:n> and R<0:n> on the basis of repair information.

As described above, the data transmission circuit 421 may output the global line output signal GIO0<0:n> of the first channel as the through-via signal TH0<0:n+1> of the first channel upon receiving the first and second control signals N<0:n> and R<0: n>, such that the data transmission circuit 421 may select a through via through which the global line output signal GIO0<0:n> of the first channel is transmitted. As described above, the first control signal N<0:n> may be a signal activated in a normal mode in which at least one through via is normally operated, and the second control signal R<0:n> may be a signal activated in a repair mode in which a defect occurs in at least one through via. That is, the first control signal N<0: n> and the second control signal R<0: n> may be activated in a complementary manner.

Although the data transmission circuit 421 and the repair information generation circuit 431 formed in the stacked chip 31 have been disclosed above, the stacked chips 32~34 may respectively include data transmission circuits 422~424 and the repair information generation circuits 432~434 may be configured to operate in substantially the same manner as the stacked chip 34. Repair information stored in the repair information generation circuits 432~434 may also be identical to each other. Therefore, the data transmission circuits 422~424 of the stacked chips 32~34 may operate in substantially the same manner as the data transmission circuit 421 for selecting a data transmission path. However, the data transmission circuit 422 formed in the stacked chip 32 may output the global line output signal GIO1<0:31> of the second channel as a through-via signal TH1<0:n+1> of the second channel upon receiving the first control signal N<0: n> and the second control signal R<0:n>. The data transmission circuit 423 formed in the stacked chip 33 may output the global line output signal GIO2<0:31> of the third channel as a through-via signal TH2<0:n+1> of the third channel upon receiving the first control signal N<0:n>. Further, the second control signal R<0:n>, and the data transmission circuit 424 formed in the stacked chip 34 may output the global line output signal GIO3<0:31> of the fourth channel as a through-via signal TH3<0:n+1> of the fourth channel upon receiving the first control signal N<0:n> and the second control signal R<0:n>.

Through the above-mentioned structure, the semiconductor device 3 according to this embodiment may perform a repair operation by shifting at least one through via on a group basis. In FIG. 3, the semiconductor device 3 may further include a base chip 35. The base chip 35 may include a data output circuit 520. The data output circuit 520 may receive a through-via signal TH0<0:n+1> of the first channel. Here, the through-via signal TH0<0:n+1> of the first channel is first output from the data transmission circuit 421 of the stacked chip 31, and is then transmitted through through vias corresponding to the first channel of the stacked chip 31, and is finally output to the data output circuit 520. The data output circuit 520 may receive a through-via signal TH1<0:n+1> of the second channel. Here, the through-via signal TH1<0:n+1> of the second channel is first output from the data transmission circuit 422 of the stacked chip 32, and is then transmitted through through vias corresponding to the second channel of the stacked chip 32, and is finally output to the data output circuit 520. The data output circuit 520 may receive a through-via signal TH2<0:n+1> of the third channel. Here, the through-via signal TH2<0:n+1> of the third channel is first output from the data transmission circuit 423 of the stacked chip 33, and is transmitted through through vias corresponding to a third channel of the stacked chip 33, and through vias corresponding to a third channel of the stacked chip 32, and through vias corresponding to a third channel of the stacked chip 31. The data output circuit 520 may receive a through-via signal TH3<0:n+1> of the fourth channel. Here, the through-via signal TH3<0:n+1> of the fourth channel is first output from the data transmission circuit 424 of the stacked chip 34, and is transmitted through through vias corresponding to a fourth channel of the stacked chip 34, through vias corresponding to a fourth channel of the stacked chip 33, through vias corresponding to a fourth channel of the stacked chip 32, and through vias corresponding to a fourth channel of the stacked chip 31. Upon receiving the first and second control signals N<0:n> and R<0:n>, the data output circuit 520 may receive first to fourth channel through-via signals TH0<0:n+1>, TH1<0:n+1>, TH2<0:n+1>, and TH3<0:n+1>, and may output the first to fourth channel through-via signals TH0<0:n+1>, TH1<0:n+1>, TH2<0:n+1>, and TH3<0:n+1> as first to fourth channel data DQ0<0:n>, DQ1<0:n>, DQ2<0:n>, and DQ3<0:n> outside the semiconductor device 3. The first and second control signals N<0: n> and R<0: n> received by the data output circuit 520 may be respectively identical to the first and second control signals N<0:n> and R<0:n> received by the data transmission circuits of the stacked chips 31~34.

For example, during a normal mode in which the first control signal N<0:n> is activated, in a lower-left-side through-via group G0 of the first stacked chip 31, the data output circuit 520 may output the through-via signal TH0<0> received from at least one through via to which the first channel CH0 is allocated, as the first data DQ0<0> of the first channel. During the normal mode, in a through-via group G0 located above the lower-left-side through-via group G0 of the first stacked chip 31, the data output circuit 520 may output the through-via signal TH0<1> received from at least one through via to which the first channel CH0 is allocated, as the second data DQ0<1> of the first channel. During the normal mode, in a through-via group G0 located at a third position in an upward direction from the lower-left-side through-via group G0 of the first stacked chip 31, the data output circuit 520 may output the through-via signal TH0<2> received from at least one through via to which the first channel CH0 is allocated, as the third data DQ0<2> of the first channel. During the normal mode, in a through-via group G0 located at a fourth position in an upward direction from the lower-left-side through-via group G0 of the first stacked chip 31, the data output circuit 520 may output the through-via signal TH0<3> received from at least one through via to which the first channel CH0 is allocated, as the fourth data DQ0<3> of the first channel. In this way, during the normal mode, the data output circuit 520 may receive the through-via signals TH0<4>~TH<31> in the same direction as the arrow of FIG. 4A, and may output the received through-via signals TH0<4>~TH<31> as the fifth to $32^{nd}$ data DQ0<4>~DQ0<31> of the first channel.

During activation of the first control signal N<0:n>, in a lower-left-side through-via group G0 of the first stacked chip 31, the data output circuit 520 may output the through-via signal TH1<0> received from at least one through via to which the second channel CH1 is allocated, as the first data DQ1<0> of the second channel. During activation of the first control signal N<0:n>, in a through-via group G0 located above the left-lower-side through-via group G0 of the first stacked chip 31, the data output circuit 520 may output the through-via signal TH1<1> received from at least one through via to which the second channel CH1 is allocated, as the second data DQ1<1> of the second channel. During activation of the first control signal N<0:n>, in a through-via group G0 located at a third position in an upward direction from the left-lower-side through-via group G0 of the first stacked chip 31, the data output circuit 520 may output the through-via signal TH1<2> received from at least one through via to which the second channel CH1 is allocated, as the third data DQ1<2> of the second channel. During activation of the first control signal N<0:n>, in a through-via group G0 located at a fourth position in an upward direction from the left-lower-side through-via group G0 of the first stacked chip 31, the data output circuit 520 may output the through-via signal TH1<3> received from at least one through via to which the second channel CH1 is allocated, as the fourth data DQ1<3> of the second channel. In this way, during activation of the first control signal N<0:n>, the data output circuit 520 may receive the through-via signals TH1<4>~TH<31> in the same direction as the arrow illustrated in FIG. 4A, and may output the received through-via signals TH1<4>~TH<31> as the fifth to $32^{nd}$ data DQ1<4>~DQ1<31> of the second channel.

In a similar way to the above method for outputting the first channel data DQ0<0:31> and the second channel data DQ1<0:31>, the data output circuit 520 may receive through-via signals TH2<0:31> from through vias to which the third channel of the first stacked chip 31 is allocated, and may output the received through-via signals TH2<0:31> as the third channel data DQ2<0:31>. The data output circuit 520 may receive through-via signals TH3<0:31> from through vias to which the fourth channel of the first stacked chip 31 is allocated, and may output the received through-via signals TH3<0:31> as the fourth channel data DQ3<0:31>.

During a repair mode in which the second control signal R<0:n> is activated, the data output circuit 520 may receive the through-via signal TH0<1> from at least one through via to which the first channel CH0 of the through-via group G0 located above the left-lower-side through-via group G0 of the first stacked chip 31 is allocated, and may output the received through-via signal TH0<1> as the first data DQ0<0> of the first channel. During the repair mode, the data output circuit 520 may receive the through-via signal TH0<2> from at least one through via to which the first channel CH0 of the through-via group G0 located at a third position in an upward direction from the left-lower-side through-via group G0 of the first stacked chip 31 is allocated, and may output the received through-via signal TH0<2> as the second data DQ0<1> of the first channel. In this way, during the repair mode, the data output circuit 520 may receive the through-via signals TH0<3>~TH0<32> from through vias to which the first channel CH0 is allocated, in the same direction as the arrow of FIG. 4A, and may output the received through-via signals TH0<3>~TH0<32> as the third to $32^{nd}$ data DQ0<2>~DQ0<31> of the first channel. Data DQ1<0>~DQ1<31> of the second channel, data DQ2<0>~DQ2<31> of the third channel, and data DQ3<0>~DQ3<31> of the fourth channel may also be output in the same way as in the aforementioned data DQ0<2>~DQ0<31>. However, the respective data may be output through through-vias to which the corresponding channels are allocated. In other words, in a similar way to the above method for outputting the first channel data DQ0<0:31>, the data output circuit 520 may receive through-via signals TH1<1:32> from through vias to which the second channel of the first stacked chip 31 is allocated, and may output the received through-via signals TH1<1:32> as the second channel data DQ1<0:31>. The data output circuit 520 may receive through-via signals TH2<1:32> from through vias to which the third channel of the first stacked chip 31 is allocated, and may output the received through-via signals TH2<1:32> as the third channel data DQ2<0:31>. The data output circuit 520 may receive through-via signals TH3<1:32> from through vias to which the fourth channel of the first stacked chip 31 is allocated, and may output the received through-via signals TH3<1:32> as the fourth channel data DQ3<0:31>. That is, during the repair mode, after the through-via group of FIG. 4A is shifted by one group as compared to the normal mode, the data output circuit 520 may receive the through-via signals TH0<1:32>, TH1<1:32>, TH2<1:32>, and TH3<1:32>, and may output the received through-via signals TH0<1:32>, TH1<1:32>, TH2<1:32>, and TH3<1:32> as the first channel data DQ0<0:31>, the second channel data DQ1<0:31>, the third channel data DQ2<0:31>, and the fourth channel data DQ3<0:31>, respectively.

The base chip 35 may further include a repair information generation circuit 530 configured to supply the first and second control signals N<0:n> and R<0:n> to the data output circuit 520. The repair information generation circuit 530 may be a constituent component, such as a fuse array, a register, etc. capable of storing information therein in the substantially same manner as in the repair information generation circuits 431~434, and may include repair information or defect information of at least one through via. The repair information generation circuit 530 may test the presence or absence of a defect in the through via, such that the repair information generation circuit 530 may store repair information in advance. The repair information stored in the repair information generation circuit 530 may be identical to repair information stored in each of the repair information generation circuits 431~434. The repair information generation circuit 530 may generate first and second control signals N<0:n> and R<0:n> on the basis of the stored repair information. In this embodiment, because the same repair information is stored in the repair information generation circuits 431~434 and the repair information generation circuit 530, the first and second control signals N<0:n> and R<0:n> generated from the repair information generation circuit 530 may be identical to first and second control signals N<0:n> and R<0:n> generated from each of the repair information generation circuits 431~434. A through-via group G0~G3 may include through vias to which a global line output signal GIO0<0:n> is transmitted when repair information is deactivated, and may be adjacent to a through-via group G0~G3 to which the global line output signal GIO0<0:n> is transmitted when the repair information is activated.

Figure 6A:
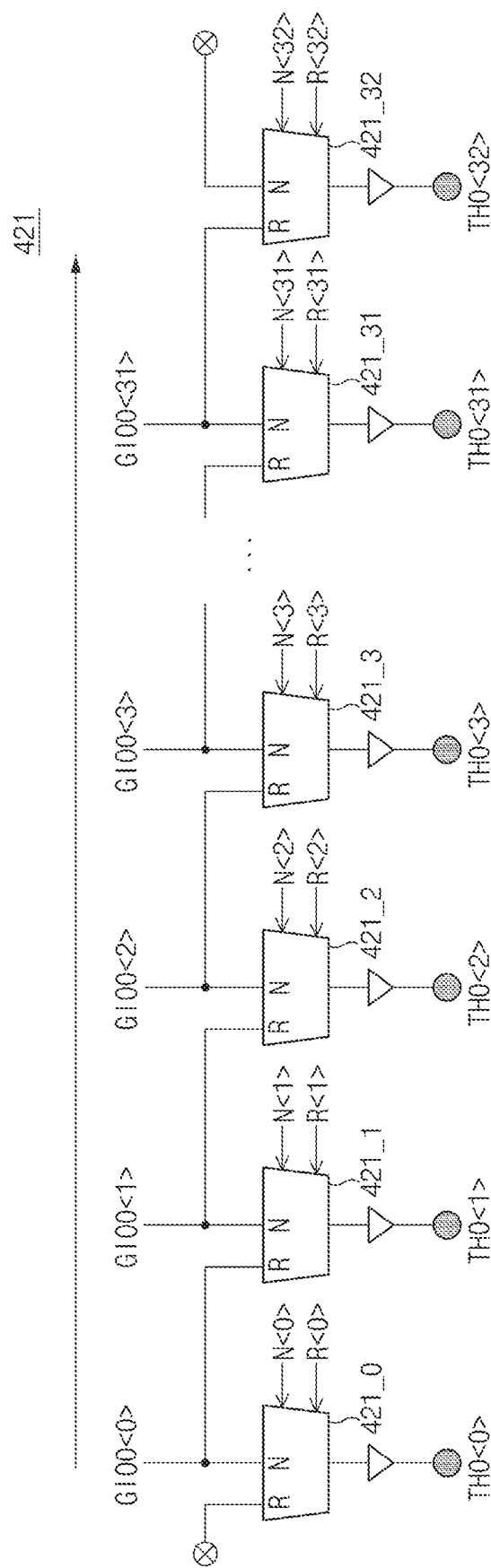
FIGS. 6A to 6D are views illustrating a representation of an example of a data transmission circuit shown in FIG. 3.
Figure 6B:
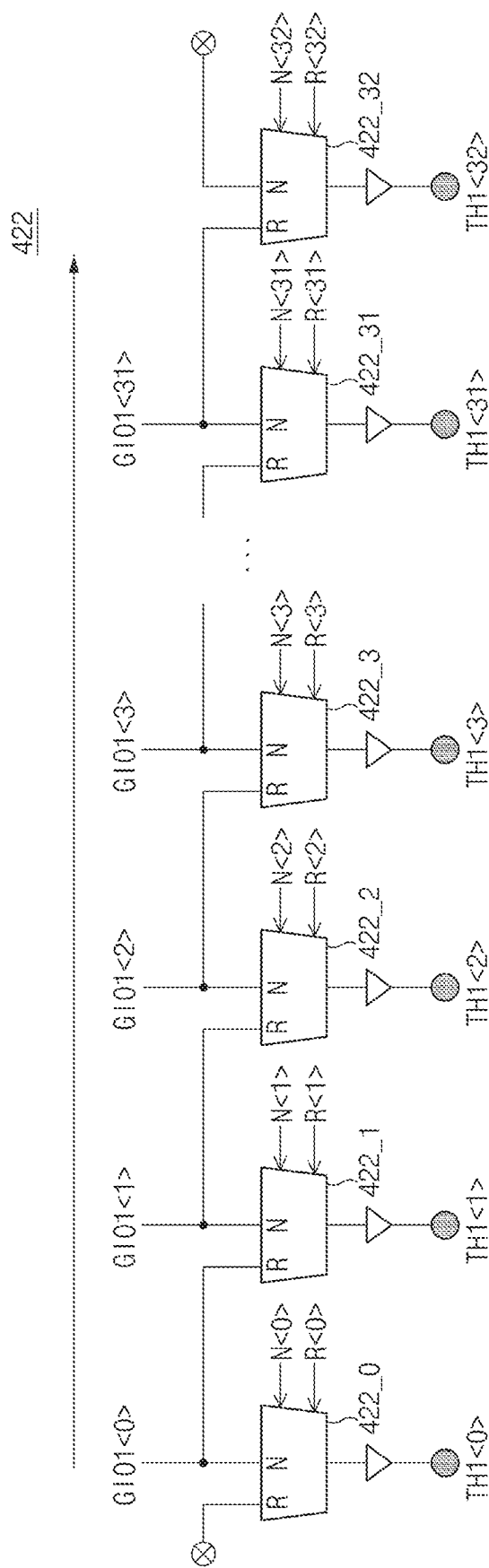
Figure 6C:
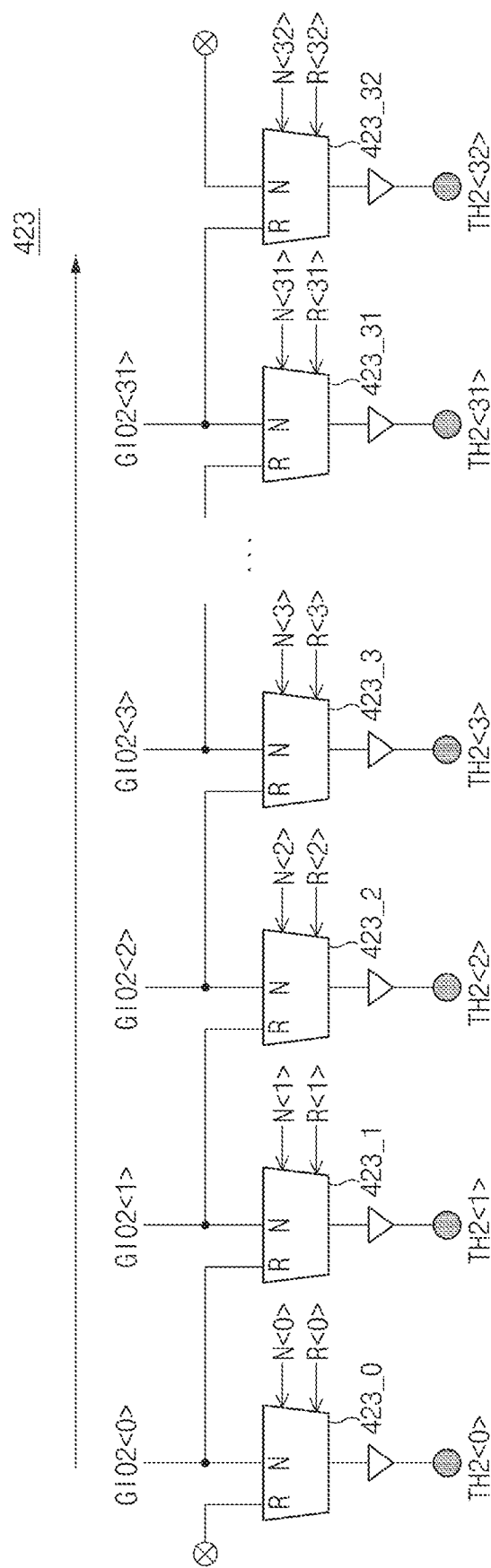
Figure 6D:
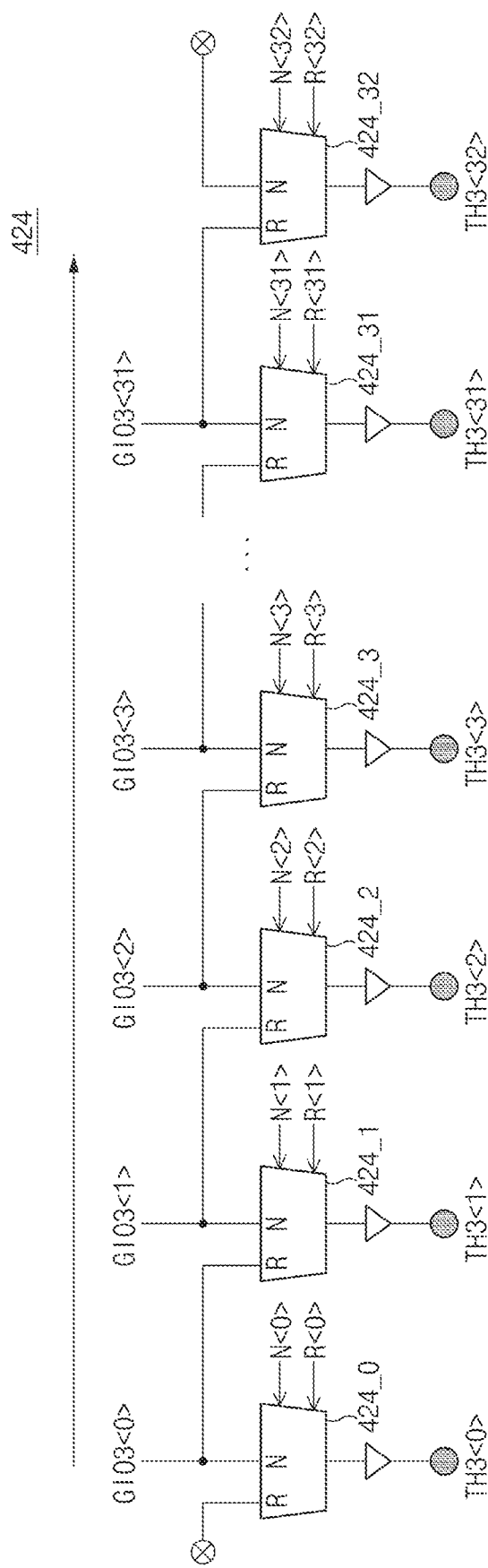

FIG. 6A is a view illustrating the data transmission circuit 421 shown in FIG. 3. FIG. 6B is a view illustrating the data transmission circuit 422 shown in FIG. 3. FIG. 6C is a view illustrating the data transmission circuit 423 shown in FIG. 3. FIG. 6D is a view illustrating the data transmission circuit 424 shown in FIG. 3.

Referring to FIG. 6A, the data transmission circuit 421 may include a plurality of transmission selection circuits 421_0 to 421_32. In each through-via group G0, the transmission selection circuits 421_0 to 421_32 may be respectively included in through vias to which the first channel is allocated.

For example, the first transmission selection circuit 421_0 may be connected to a through via (i.e., a shaded through via connected to the I/O circuit, from among through vias of a left-lower-side through-via group G0) to which the first through-via signal TH0<0> of the first channel is transmitted. The second transmission selection circuit 421_1 may be connected to a through via (i.e., a shaded through via connected to the I/O circuit, from among through vias of a through-via group G0 located above the lower-left-side through-via group G0) to which the second through-via signal TH0<1> of the first channel is transmitted. The third to $33^{rd}$ transmission selection circuits 421_2 to 421_32 may also be connected in substantially the same manner as the first transmission selection circuit 421_0 and the second transmission selection circuit 421_1. In other words, the first transmission selection circuit 421_0, the second transmission selection circuit 421_1, and the like may be sequentially connected to the shaded through vias of FIG. 4A in the same direction as the arrow. Each of the first to $33^{rd}$ transmission selection circuits 421_0 to 421_32 may receive corresponding first and second control signals N<0:32> and R<0:32>.

A first global line output signal GIO0<0> of the first channel may be input to a first input terminal N of the first transmission selection circuit 421_0, and a second input terminal R may be connected to a floating node. A second global line output signal GIO0<1> of the first channel may be input to a first input terminal N of the second transmission selection circuit 421_1, and the first global line output signal GIO0<0> of the first channel may be input to a second input terminal R of the second transmission selection circuit 421_1. A third global line output signal GIO0<2> of the first channel may be input to a first input terminal N of the third transmission selection circuit 421_2, and the second global line output signal GIO0<1> of the first channel may be input to a second input terminal R of the third transmission selection circuit 421_2. In this way, a $32^{nd}$ global line output signal GIO0<31> of the first channel may be input to a first input terminal N of the $32^{nd}$ transmission selection circuit 421_31, and a $31^{st}$ global line output signal GIO0<30> of the first channel may be input to a second input terminal R of the $32^{nd}$ transmission selection circuit 421_31. A floating node may be connected to a first input terminal N of the $33^{rd}$ transmission selection circuit 421_32, and the $32^{nd}$ global line output signal GIO0<31> of the first channel may be input to a second input terminal R of the $33^{rd}$ transmission selection circuit 421_32.

Referring to FIGS. 6B to 6D, the above-mentioned method may also be equally applied to the remaining transmission selection circuits 422_0~422_32, 423_0~423_32, and 424_0~424_32. That is, the transmission selection circuits 422_0 to 422_32 may be sequentially connected to the shaded through vias of the second stacked chip 32 in the same direction as the arrow, the transmission selection circuits 423_0 to 423_32 may be sequentially connected to the shaded through vias of the third stacked chip 33 in the same direction as the arrow, and the transmission selection circuits 424_0 to 424_32 may be sequentially connected to the shaded through vias of the fourth stacked chip 34 in the same direction as the arrow.

If all the first control signals N<0:32> are activated or enabled, the transmission selection circuits 421_0 to 421_32 may respectively output signals (i.e., global line output signals GIO0<0:31> and floating-node signals) received by the first input terminals N thereof as through-via signals TH0<0> to TH0<32> of the first channel. Accordingly, the global line output signals GIO0<0> to GIO0<31> of the first channel may be output as the through-via signals TH0<0> to TH0<31> of the first channel, and a floating signal may be output as the $33^{rd}$ through-via signal TH0<32> of the first channel. If all the second control signals R<0:32> are activated or enabled, the transmission selection circuits 421_0 to 421_32 may respectively output signals (i.e., floating-node signals and global line output signals GIO0<0:31> of the first channel) received by the second input terminals R thereof as through-via signals TH0<0> to TH0<32> of the first channel. Accordingly, the floating signal may be output as the first through-via signal TH0<0> of the first channel, and global line output signals GIO0<0> to GIO0<31> of the $0^{th}$ channel may be output as the second to $33^{rd}$ through-via signals TH0<0> to TH0<32> of the first channel. In other words, if the second control signals R<0:32> are activated, the first to $32^{nd}$ global line output signals GIO0<0> to GIO0<31> of the fourth channel may be shifted by a single through-via group in the same direction as the arrow of FIG. 4D and then transmitted, as compared to the other case in which the first control signals N<0:32> are activated.

In other words, the data transmission circuit 421 may transmit the global line output signals GIO0<0:31> of the first channel as through-via signals TH0<0:31> of the first channel (in the case of the normal mode), and may transmit the global line output signals GIO0<0:31> of the first channel as through-via signals TH0<1:31> of the first channel (in the case of a repair mode), such that this means that through vias through which the global line output signals GIO0<0:31> of the first channel are transmitted are selected. The through-via signals TH0<0> to TH0<32> of the first channel may be input to the data output circuit 520 of the base chip 35.

Although the above-mentioned embodiment has exemplarily disclosed the data transmission circuit 421 included in the first stacked chip 31, the scope and spirit of the present disclosure is not limited thereto, and the embodiment may also be applied to the remaining data transmission circuits 422, 423, and 424 respectively included in the second to fourth stacked chips 32, 33, and 34. In more detail, the through via signals TH1<0>~TH1<32> of the second channel may be output through the data transmission circuit 422 of the second stacked chip 32. The through-via signals TH1<0>~TH1<32> of the second channel may be input to the data output circuit 520, after passing through not only through vias (shaded through vias of FIG. 4B) corresponding to the second channel of the second stacked chip 32, but also through vias corresponding to the second channel of the first stacked chip 31 along the dotted lines of a connection structure of the second channel of the structure shown in FIG. 5. The through via signals TH2<0>~TH2<32> of the third channel may be output through the data transmission circuit 423 of the third stacked chip 33. The through-via signals TH2<0>~TH2<32> of the third channel may be input to the data output circuit 520, after sequentially passing through through vias (shaded through vias of FIG. 4C) corresponding to the third channel of the third stacked chip 33, through vias corresponding to the third channel of the second stacked chip 32, and through vias corresponding to the third channel of the first stacked chip 31 along the one-dot chain lines of a connection structure of the third channel of the structure shown in FIG. 5. The through via signals TH3<0>~TH3<32> of the fourth channel may be output through the data transmission circuit 424 of the fourth stacked chip 34. The through-via signals TH3<0>~TH3<32> of the fourth channel may be input to the data output circuit 520, after sequentially passing through through vias (shaded through vias of FIG. 4D) corresponding to the fourth channel of the fourth stacked chip 33, through vias corresponding to the fourth channel of the third stacked chip 33, through vias corresponding to the fourth channel of the second stacked chip 32, and through vias corresponding to the fourth channel of the first stacked chip 31 along the two-dot chain lines of a connection structure of the fourth channel of the structure shown in FIG. 5.

Figure 7:
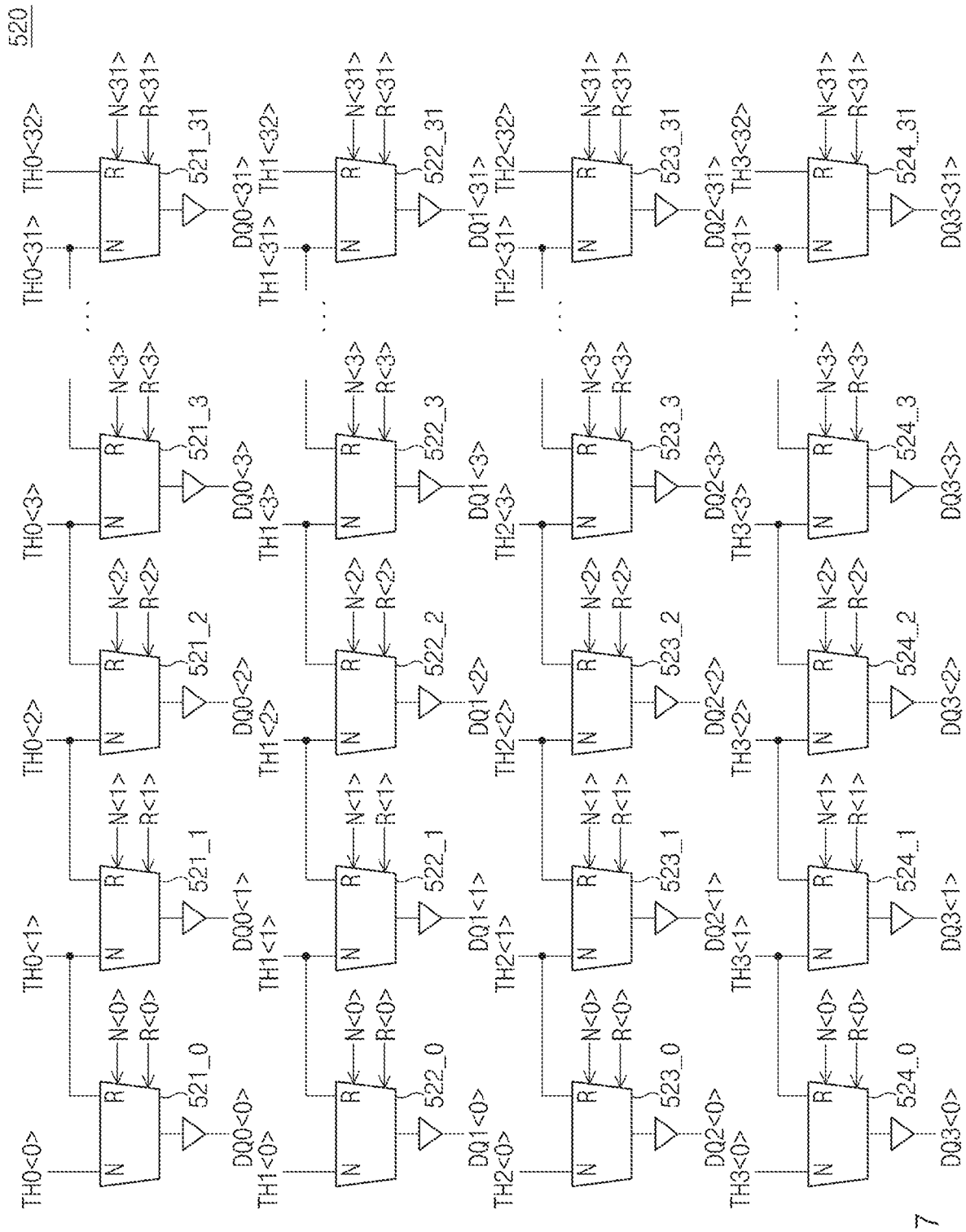
FIG. 7 is a view illustrating a representation of an example of a data output circuit shown in FIG. 3.

FIG. 7 is a view illustrating a representation of an example of the data output circuit 520 shown in FIG. 3.

Referring to FIG. 7, the data output circuit 520 may include a plurality of output selection circuits having a number in proportion to the number of output data and the number of channels. In this embodiment, 32-bit data is output for each of four channels CH0 to CH3, such that the data output circuit 520 may include 128 output selection circuits 521_0~521_31, 522_0~522_31, 523_0~523_31, and 524_0~524_31.

A first through-via signal TH0<0> of the first channel may be input to a first input terminal N of the first output selection circuit 521_0 of the first channel, and a second through-via signal TH0<1> of the first channel may be input to a second input terminal R of the first output selection circuit 521_0 of the first channel. A first through-via signal TH0<1> of the first channel may be input to a first input terminal N of the second output selection circuit 521_1 of the first channel, and a third through-via signal TH0<2> of the first channel may be input to a second input terminal R of the second output selection circuit 521_1 of the first channel. In this way, a $32^{nd}$ through-via signal TH0<31> of the first channel may be input to a first input terminal N of the $32^{nd}$ output selection circuit 521_31 of the first channel, and a $33^{rd}$ through-via signal TH0<32> of the first channel may be input to a second input terminal R of the $32^{nd}$ output selection circuit 521_31 of the first channel.

During the normal mode, if the first control signals N<0:31> are activated, the first to $32^{nd}$ output selection circuits 521_0~521_31 of the first channel may respectively receive first to $32^{nd}$ through-via signals TH0<0:31> of the first channel through the first input terminals N thereof, and may respectively output the first to $32^{nd}$ through-via signals TH0<0:31> as the output data DQ0<0>~DQ0<31> of the first channel. During the repair mode, if the second control signals R<0:31> are activated, the first to $32^{nd}$ output selection circuits 521_0~521_31 of the first channel may respectively receive second to $33^{rd}$ through-via signals TH0<1:32> of the first channel through the second input terminals R thereof, and may respectively output the second to $33^{rd}$ through-via signals TH0<1:32> as the output data DQ0<0>~DQ0<31> of the first channel.

The through-via signals TH1<0>~TH1<31> of the second channel may be respectively input to the first input terminals N of the first to $32^{nd}$ output selection circuits 522_0~522_31 of the second channel, and the through-via signals TH1<1>~TH1<32> of the second channel may be respectively input to the second input terminals R of the first to $32^{nd}$ output selection circuits 522_0~522_31 of the second channel. During the normal mode, upon receiving the first to $32^{nd}$ through-via signals TH1<0>~TH1<31> of the second channel through the first input terminals N, the first to $32^{nd}$ output selection circuits 522_0~522_31 of the second channel may output the first to $32^{nd}$ through-via signals TH1<0>~TH1<31> of the second channel as the output data DQ1<0>~DQ1<31> of the second channel. During the repair mode, upon receiving the second to $33^{rd}$ through-via signals TH1<1>~TH1<32> through the second input terminals R, the first to $32^{nd}$ output selection circuits 522_0–522_31 of the second channel may output the second to $33^{rd}$ through-via signals TH1<1>~TH1<32> as the output data DQ1<0>~DQ1<31> of the second channel.

The through-via signals TH2<0>~TH2<31> of the third channel may be respectively input to the first input terminals N of the first to $32^{nd}$ output selection circuits 523_0~523_31 of the third channel. The through-via signals TH2<1>~TH2<32> of the third channel may be respectively input to the second input terminals R of the first to $32^{nd}$ output selection circuits 523_0~523_31 of the third channel. During the normal mode, the first to $32^{nd}$ output selection circuits 523_0~523_31 of the third channel may respectively receive the through-via signals TH2<0>~TH2<31> of the third channel through the first input terminals N thereof, and may respectively output the through-via signals TH2<0>~TH2<31> of the third channel as the output data DQ2<0>~DQ2<31> of the third channel. During the repair mode, the first to $32^{nd}$ output selection circuits 523_0~523_31 of the third channel may respectively receive the through-via signals TH2<1>~TH2<32> of the third channel through the second input terminals R thereof, and may respectively output the through-via signals TH2<1>~TH2<32> of the third channel as the output data DQ2<0>~DQ2<31> of the third channel.

The through-via signals TH3<0>~TH3<31> of the fourth channel may be respectively input to the first input terminals N of the first to $32^{nd}$ output selection circuits 524_0~524_31 of the fourth channel. The through-via signals TH3<1>~TH3<32> of the fourth channel may be respectively input to the second input terminals R of the first to $32^{nd}$ output selection circuits 524_0~524_31 of the fourth channel. During the normal mode, the first to $32^{nd}$ output selection circuits 524_0~524_31 of the fourth channel may receive the through-via signals TH3<0>~TH3<31> of the fourth channel through the first input terminal N thereof, and may output the through-via signals TH3<0>~TH3<31> of the fourth channel as the output data DQ3<0>~DQ3<31> of the fourth channel. During the repair mode, the first to $32^{nd}$ output selection circuits 524_0~524_31 of the fourth channel may receive the through-via signals TH3<1>~TH3<32> of the fourth channel through the second input terminal R thereof, and may output the through-via signals TH3<1>~TH3<32> of the fourth channel as the output data DQ3<0>~DQ3<31> of the fourth channel.

The output selection circuits 521_0~521_31, 522_0~522_31, 523_0~523_31, and 524_0~524_31 may receive the corresponding first and second control signals N<0:n> and R<0:n>. The output selection circuits 521_0~521_31 of the first channel, the output selection circuits 522_0~522_31 of the second channel, the output selection circuits 523_0~523_31 of the third channel, and the output selection circuits 524_0~524_31 of the fourth channel may commonly receive the same first control signals N<0:n> and the same second control signals R<0:n>. The first control signals N<0:n> may be activated in the normal mode, and the second control signals R<0: n> may be activated in the repair mode. The first control signals N<0:n> and the second control signals R<0:n> may be activated in a complementary manner.

Although the above-mentioned embodiment has exemplarily disclosed that each of the through-via groups G0~G3 is formed in a square shape for convenience of description and better understanding of the present disclosure, it may be preferable that neighbor through vias adjacent to one another in the through-via groups G0~G3 formed in a same chip 31, 32, 33, or 34 for transmitting through-via signals of different channels are spaced apart from one another by a same distance. For example, each of the through-via groups G0~G3 may be formed in a regular polygonal shape (for example, a regular triangular shape, a regular pentagonal shape, a regular hexagonal shape, etc.) or in a diamond shape.

The connection shapes of through vias of the chips adjacent to one another in the stacked direction are not limited to the above-mentioned embodiments, and it may be preferable that the through vias of the chips be connected to one another in a substantially same manner that the same channel length is implemented.

As is apparent from the above description, the semiconductor device according to the embodiment of the present disclosure may reduce a skew between channels.

Those skilled in the art will appreciate that the disclosure may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the disclosure or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device including a plurality of stacked chips comprising a first chip, a second chip adjacent to one surface of the first chip, and a third chip adjacent to another surface of the first chip, the semiconductor device comprising:

each of the stacked chips including an arrayed plurality of through-via groups with each through-via group including a plurality of through vias arranged in a polygonal shape, wherein the arrayed plurality of through-via groups of each chip are formed at corresponding positions in a stacked direction, and wherein the plurality of through vias within each through-via group of each chip are formed at corresponding positions in the stacked direction, a first through via formed in a first through-via group of the first chip and a second through via formed in a corresponding first through-via group of the second chip are connected to each other through a first line, and the first through via formed in the first chip and a third through via formed in a corresponding first through-via group of the third chip are connected to each other through a second line, an extension direction of the first line is different from an extension direction of the second line, and the through vias, that are connected to one another and formed in corresponding through-via groups of different chips, are interconnected to have a spiral shape winding a shape formed by extending from the polygonal shape in which the plurality of through vias of through-via groups of the third chip are arranged to the polygonal shape in which the plurality of through vias of corresponding through-via groups of the second chip are arranged in the stacked direction, wherein each of the plurality of through vias for each through-via group represents a different allocated channel, wherein each through via representing a channel is offset with respect to a through via representing the same channel in a corresponding through-via group of an adjacent chip in the stacked direction, and wherein through vias representing the same channel in different through-via groups of the same chip collectively transmit a plurality of signals corresponding to the same channel.

2. The semiconductor device according to claim 1, wherein the plurality of through vias of each through-via group of each chip are arranged in a regular polygonal shape or a diamond shape.

3. The semiconductor device according to claim 1, wherein the plurality of through vias of each through-via group of each chip are arranged in a square shape.

4. The semiconductor device according to claim 1, wherein the first line is substantially identical in length to the second line.

5. The semiconductor device according to claim 1, wherein an angle between a virtually straight line connecting the first through via to the second through via and an axis in the stacked direction passing through the first through via formed in the first chip is substantially identical to an angle between a virtually straight line connecting the first through via to the third through via and the axis.

6. The semiconductor device according to claim 1, wherein the plurality of through vias of each through-via group of each chip are allocated different channels.

7. The semiconductor device according to claim 1, wherein the through vias of each through-via group of each chip disposed at corresponding positions in the stacked direction are allocated to different channels.

8. The semiconductor device according to claim 7, wherein the through vias of each through-via group of at least one chip disposed at the corresponding positions in the stacked direction are connected to an input/output (I/O) circuit.

9. A semiconductor device including a plurality of stacked chips, the semiconductor device comprising:
    each of the stacked chips including an arrayed plurality of through-via groups each including a plurality of through vias arranged in a polygonal shape,
    wherein the through vias contained in each through-via group are allocated to different channels,
        the plurality of through-via groups of each chip are formed at corresponding positions in a stacked direction,
        different channels are allocated to through vias formed at corresponding positions in the stacked direction,
        the respective through-via groups of each chip are connected to through vias of a chip adjacent in the stacked direction through a line in a manner that lengths of the respective channels are substantially identical to one another, and
        the connected through vias are interconnected to have a spiral shape winding a shape formed by extending from the polygonal shape in which the plurality of through vias of a bottom chip are arranged to the polygonal shape in which the plurality of through vias of a upper chip are arranged in the stacked direction,
    wherein each of the plurality of through vias for each through-via group represents a different allocated channel, wherein each through via representing a channel is offset with respect to a through via representing the same channel in a corresponding through-via group of an adjacent chip in the stacked direction, and wherein through vias representing the same channel in different through-via groups of the same chip collectively transmit a plurality of signals corresponding to the same channel.

10. The semiconductor device according to claim 9, wherein each of the plurality of through-via groups of each chip is formed in a square shape.

11. The semiconductor device according to claim 9, wherein:
    each of the stacked chips includes a plurality of through-via groups; and
    the same channel is allocated to through vias formed at corresponding positions in a plurality of through-via groups contained in the same chip.

12. The semiconductor device according to claim 9, wherein each of the plurality of stacked chips includes:
    a data transmission circuit configured to output global line output signals generated from each chip as through-via signals to be transmitted through through vias formed in each chip, on the basis of repair information,
    wherein the data transmission circuits formed in the plurality of stacked chips are configured to transmit different channels of data.

13. The semiconductor device according to claim 12, wherein the data transmission circuit is configured to transmit through-via signals composed of several bits through through vias disposed at corresponding positions of a plurality of through-via groups formed in the chip including the corresponding data transmission circuit.

14. The semiconductor device according to claim 12, wherein:
    a through-via group including through vias to which a global line output signal is transmitted when the repair information is deactivated, is adjacent, in a chip including the data transmission circuit, to a through-via group including through vias to which the global line output signal is transmitted when the repair information is activated.

15. The semiconductor device according to claim 9, further comprising:
    a base chip stacked over which the plurality of stacked chips are stacked,
    wherein the base chip further includes:
        a data output circuit configured to receive through-via signals from a plurality of through-via groups of a chip stacked adjacent to the corresponding base chip, and to output the received through-via signals as output data on the basis of repair information.

16. The semiconductor device according to claim 15, wherein:
    a through-via group including through vias that receive the through-via signals when the repair information is deactivated, is adjacent, in a chip stacked adjacent to the base chip, to a through-via group including through vias that receive the through-via signals when the repair information is activated.

17. The semiconductor device according to claim 9, wherein the plurality of through-via groups formed in the same chip are spaced apart from each other by a same distance.

18. A semiconductor device including a plurality of stacked chips, the semiconductor device comprising:
    each of the stacked chips including an arrayed plurality of groups with each group including a plurality of through vias respectively allocated to a plurality of channels,
    wherein the plurality of through vias within each group of each chip are formed at corresponding positions in a stacked direction,
        different channels are allocated to through vias of each group formed at corresponding positions in the stacked direction,
        the respective through vias of each group of each chip are electrically connected to through vias of a corresponding group that are formed in a chip adjacent to one side in the stacked direction and correspond to the same channel, through a first line, and are electrically connected to through vias of another corresponding group that are formed in a chip adjacent to another side in the stacked direction and correspond to the same channel, through a second line,
        the first line is substantially identical in length to the second line, and
        the connected through vias are interconnected to have a spiral shape winding a shape formed by extending from a polygonal shape in which the plurality of through vias of a bottom chip are arranged to a polygonal shape in which the plurality of through vias of a upper chip are arranged in the stacked direction,
    wherein each of the plurality of through vias for each group represents a different allocated channel, wherein each through via representing a channel is offset with respect to a through via representing the same channel in a corresponding group of an adjacent chip in the stacked direction, and wherein through vias representing the same channel in different groups of the same chip collectively transmit a plurality of signals corresponding to the same channel.

* * * * *